(12) United States Patent
Fukuhara et al.

(10) Patent No.: US 11,588,465 B2
(45) Date of Patent: Feb. 21, 2023

(54) STACKED TEMPERATURE COMPENSATED ACOUSTIC WAVE DEVICE WITH HIGH THERMAL CONDUCTIVITY

(71) Applicant: SKYWORKS SOLUTIONS, INC., Irvine, CA (US)

(72) Inventors: Hironori Fukuhara, Ibaraki (JP); Rei Goto, Osaka (JP); Takeshi Furusawa, Toyonaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 89 days.

(21) Appl. No.: 17/093,756

(22) Filed: Nov. 10, 2020

(65) Prior Publication Data

US 2021/0159877 A1 May 27, 2021

Related U.S. Application Data

(60) Provisional application No. 62/940,402, filed on Nov. 26, 2019.

(51) Int. Cl.
*H03H 9/02* (2006.01)
*H03H 9/64* (2006.01)

(52) U.S. Cl.
CPC .... *H03H 9/02574* (2013.01); *H03H 9/02834* (2013.01); *H03H 9/6406* (2013.01)

(58) Field of Classification Search
CPC ........... H03H 9/02574; H03H 9/02834; H03H 9/6406; H03H 9/0547; H03H 9/1064
USPC .......................... 333/133, 187–188, 193–196
See application file for complete search history.

(56) References Cited

U.S. PATENT DOCUMENTS

2017/0250669 A1* 8/2017 Kuroyanagi ....... H03H 9/02992

* cited by examiner

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

An electronic device comprises a first substrate having a first surface bonded to a first surface of a second substrate, one or more acoustic wave devices disposed on the first surface of each of the first substrate and the second substrate, and a thermally conductive layer disposed on a second surface of the first substrate opposite the first surface of the first substrate. The thermally conductive layer has a higher thermal conductivity than a material of which the first substrate is formed to reduce an operating temperature of the first substrate.

19 Claims, 18 Drawing Sheets

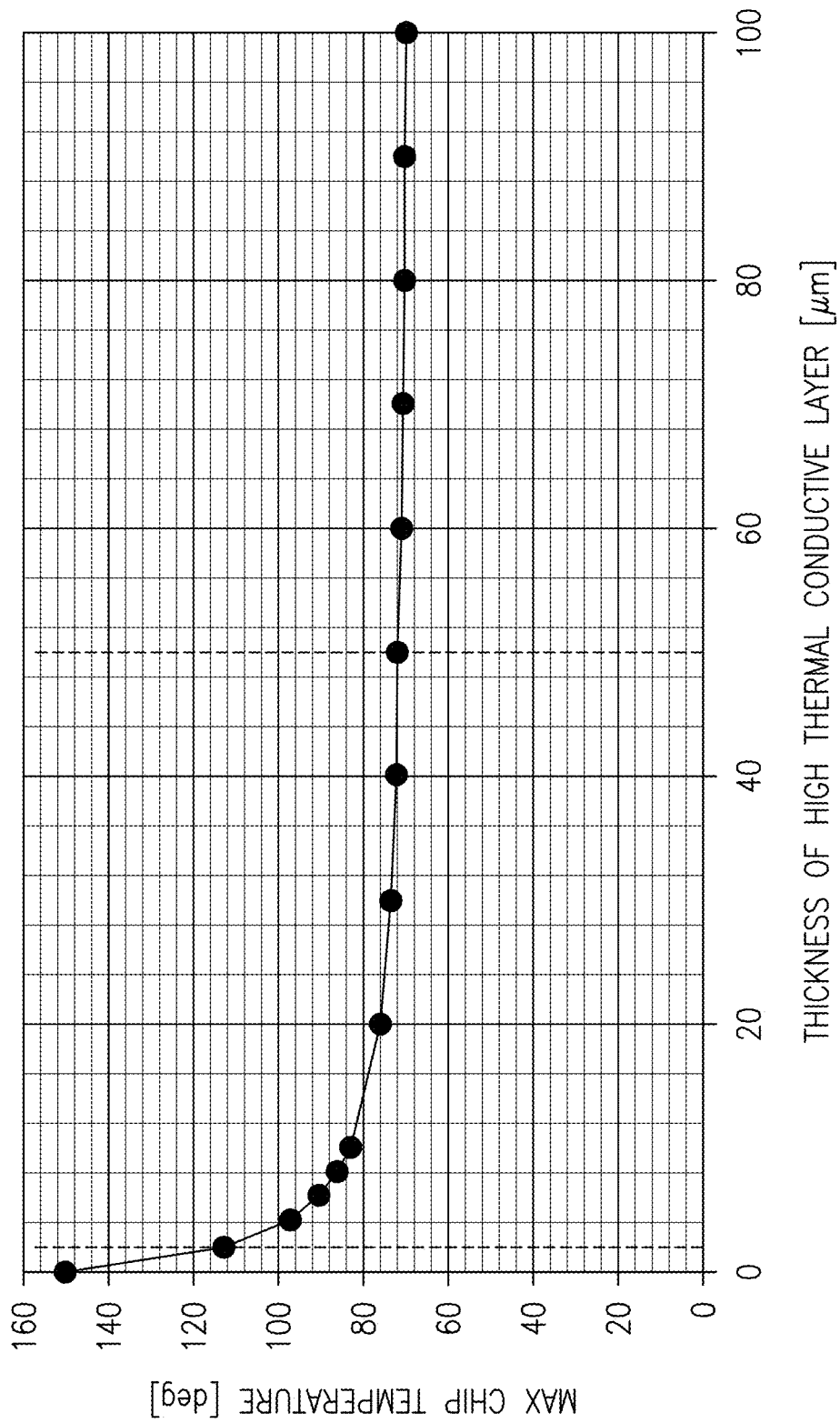

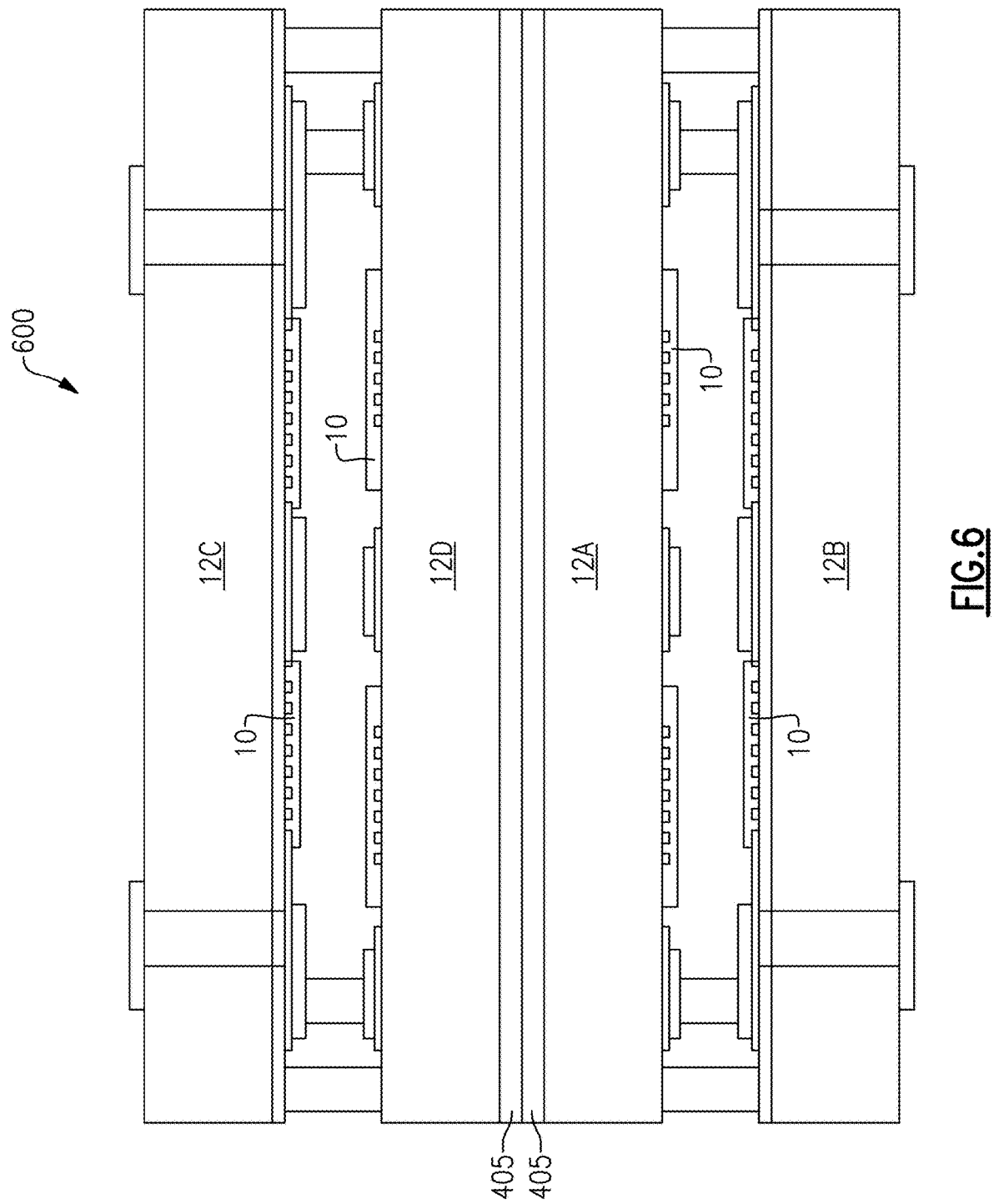

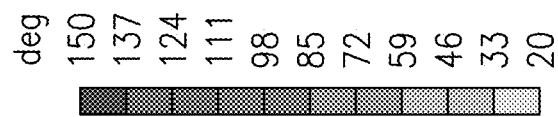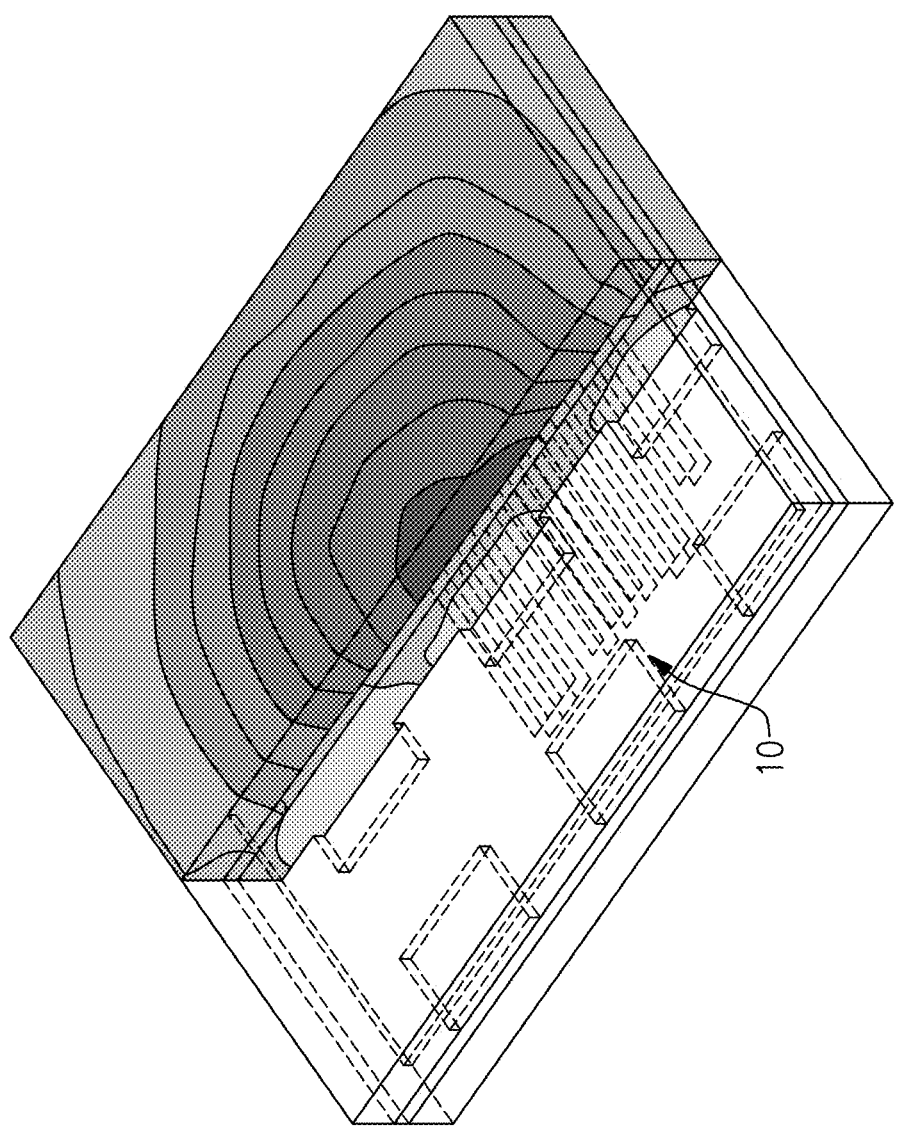
FIG.7A

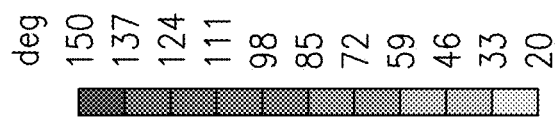
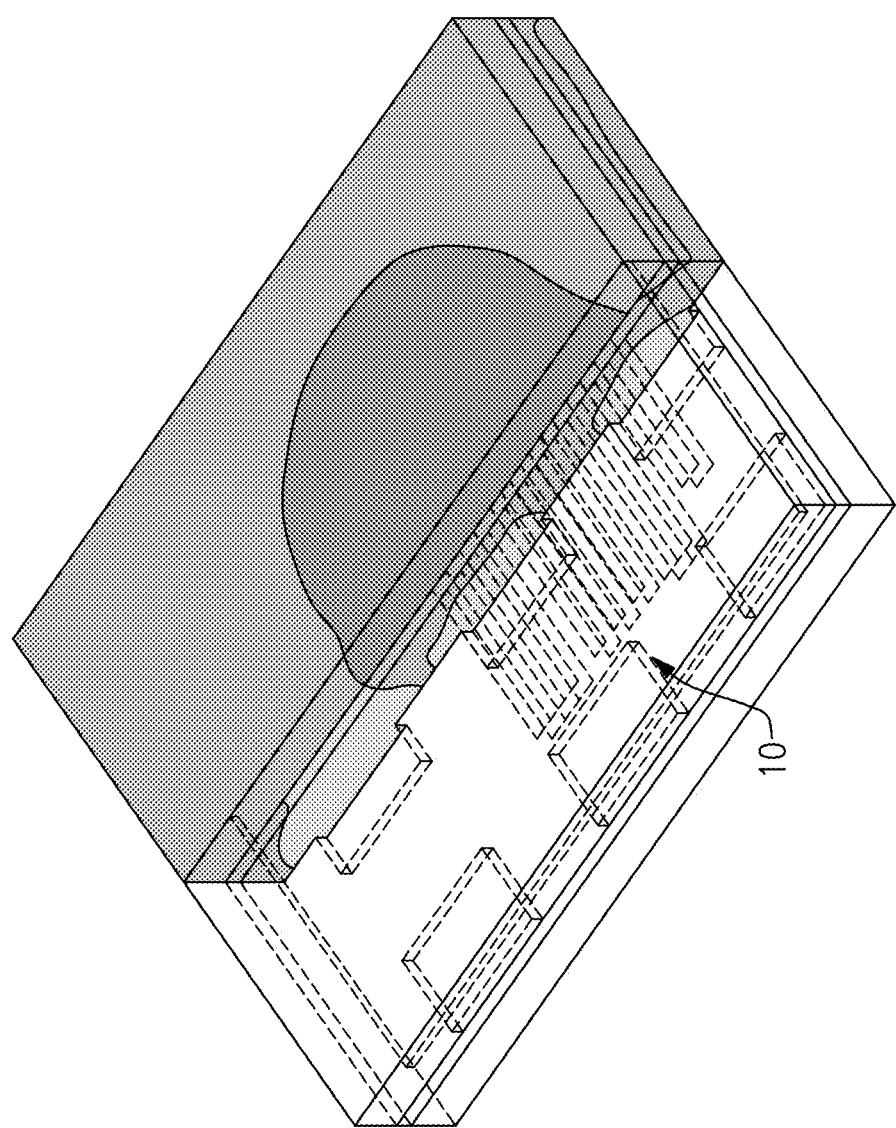
FIG.8A

STACKED TEMPERATURE COMPENSATED ACOUSTIC WAVE DEVICE WITH HIGH THERMAL CONDUCTIVITY

CROSS-REFERENCE TO RELATED APPLICATIONS

This application claims priority under 35 U.S.C. § 119(e) to U.S. Provisional Patent Application Ser. No. 62/940,402, titled "STACKED TEMPERATURE COMPENSATED ACOUSTIC WAVE DEVICE WITH HIGH THERMAL CONDUCTIVITY," filed Nov. 26, 2019, incorporated herein by reference for all purposes.

BACKGROUND

Technical Field

Embodiments of this disclosure relate to acoustic wave devices and heat dissipation methods and structures for same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer or a diplexer.

SUMMARY

In accordance with one aspect, there is provided an electronic device. The electronic device comprises a first substrate having a first surface bonded to a first surface of a second substrate, one or more acoustic wave devices disposed on the first surface of each of the first substrate and the second substrate, and a thermally conductive layer disposed on a second surface of the first substrate opposite the first surface of the first substrate, the thermally conductive layer having a higher thermal conductivity than a material of which the first substrate is formed to reduce an operating temperature of the first substrate.

In some embodiments, both the first and second substrates are formed of a piezoelectric material. The one or more acoustic wave devices may be surface acoustic wave devices. The one or more acoustic wave devices may be temperature compensated surface acoustic wave devices.

In some embodiments, the first substrate is bonded to the second substrate by a frame circumscribing peripheries of the first substrate and second substrate. The frame may be formed of a material with a higher thermal conductivity than the material of which the first substrate is formed. The frame may be formed of a metal. The frame and the first surfaces of the first substrate and second substrate may define a cavity in which the one or more acoustic wave devices are disposed.

In some embodiments, the electronic device further comprises a through wafer via passing from the first side of the second substrate to a second side of the second substrate opposite the first side of the second substrate.

In some embodiments, the electronic device further comprises one or more vias passing from the first side of the first substrate to the first side of the second substrate and electrically connecting the one or more acoustic wave devices.

In some embodiments, the one or more acoustic wave devices form a radio frequency filter.

In accordance with another aspect there is provided a radio frequency device module. The radio frequency device module includes an electronic device. The electronic device comprises a first substrate having a first surface bonded to a first surface of a second substrate, one or more acoustic wave devices disposed on the first surface of each of the first substrate and the second substrate, and a thermally conductive layer disposed on a second surface of the first substrate opposite the first surface of the first substrate, the thermally conductive layer having a higher thermal conductivity than a material of which the first substrate is formed to reduce an operating temperature of the first substrate. The one or more acoustic wave devices form a radio frequency filter.

In accordance with another aspect there is provided a radio frequency device. The radio frequency device includes a radio frequency module. The radio frequency device module includes an electronic device. The electronic device comprises a first substrate having a first surface bonded to a first surface of a second substrate, one or more acoustic wave devices disposed on the first surface of each of the first substrate and the second substrate, and a thermally conductive layer disposed on a second surface of the first substrate opposite the first surface of the first substrate, the thermally conductive layer having a higher thermal conductivity than a material of which the first substrate is formed to reduce an operating temperature of the first substrate. The one or more acoustic wave devices form a radio frequency filter.

In accordance with another aspect there is provided a method of forming an electronic device. The method comprises forming one or more acoustic wave devices on first surfaces of each of a first substrate and a second substrate, bonding the first face of the first substrate to the first face of the second substrate, and forming a thermally conductive layer on a second surface of the first substrate opposite the first surface of the first substrate. The thermally conductive layer has a higher thermal conductivity than a material of which the first substrate is formed to reduce an operating temperature of the first substrate.

In some embodiments, bonding the first face of the first substrate to the first face of the second substrate includes bonding the first face of the first substrate to the first face of the second substrate with a frame circumscribing peripheries of the first and second substrate, the frame being formed of a material having a higher thermal conductivity than the material of which the first substrate is formed. Bonding the first face of the first substrate to the first face of the second substrate with the frame may include defining a cavity in which the one or more acoustic wave devices are disposed.

In some embodiments, the method further comprises forming a through wafer via passing from the first side of the second substrate to a second side of the second substrate opposite the first side of the second substrate.

In some embodiments, the method further comprises forming a radio frequency filter from the one or more acoustic wave devices.

In some embodiments, the method further comprises forming a radio frequency device module including the radio frequency filter.

In some embodiments, the method further comprises forming a radio frequency electronic device including the radio frequency device module.

BRIEF DESCRIPTION OF THE DRAWINGS

Embodiments of this disclosure will now be described, by way of non-limiting example, with reference to the accompanying drawings.

FIG. 5 is a chart illustrating results of a simulation of operating temperature of a substrate of the device of FIG. 4 versus thickness of a thermally conductive layer of the device;

FIG. 6 is a cross-sectional view of an example of another electronic device including stacked piezoelectric substrates and acoustic wave devices in accordance with an aspect of the present disclosure;

FIG. 7A is an isometric view illustrating results of a simulation of operating temperature of a device as illustrated in FIG. 3;

FIG. 8A is an isometric view illustrating results of a simulation of operating temperature of a device as illustrated in FIG. 4;

DETAILED DESCRIPTION OF CERTAIN EMBODIMENTS

Figure 1A:
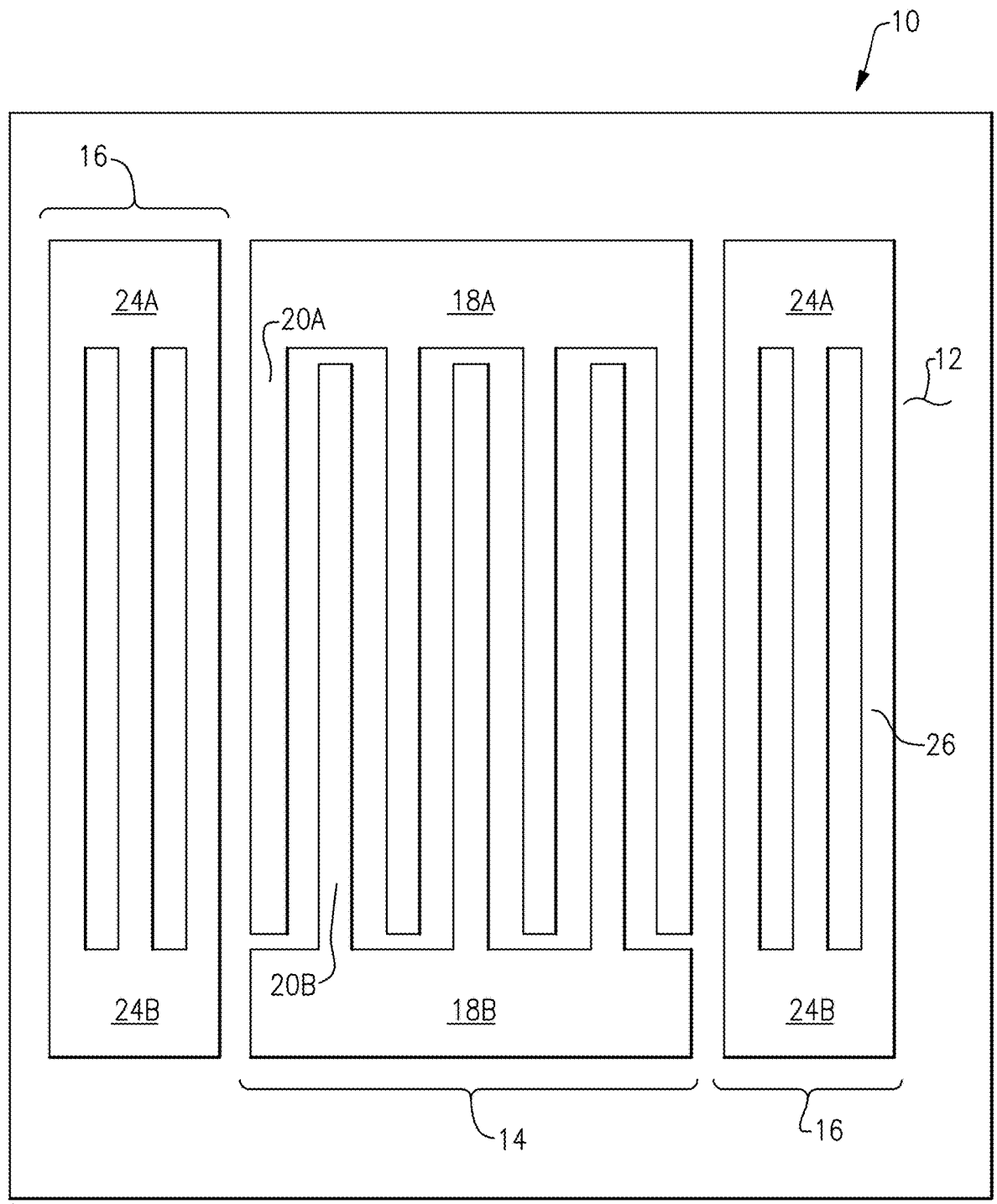
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, diplexer, balun, etc.

Acoustic wave resonator 10 is formed on a piezoelectric substrate, for example, a lithium tantalate ($LiTaO_3$) or lithium niobate ($LiNbO_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
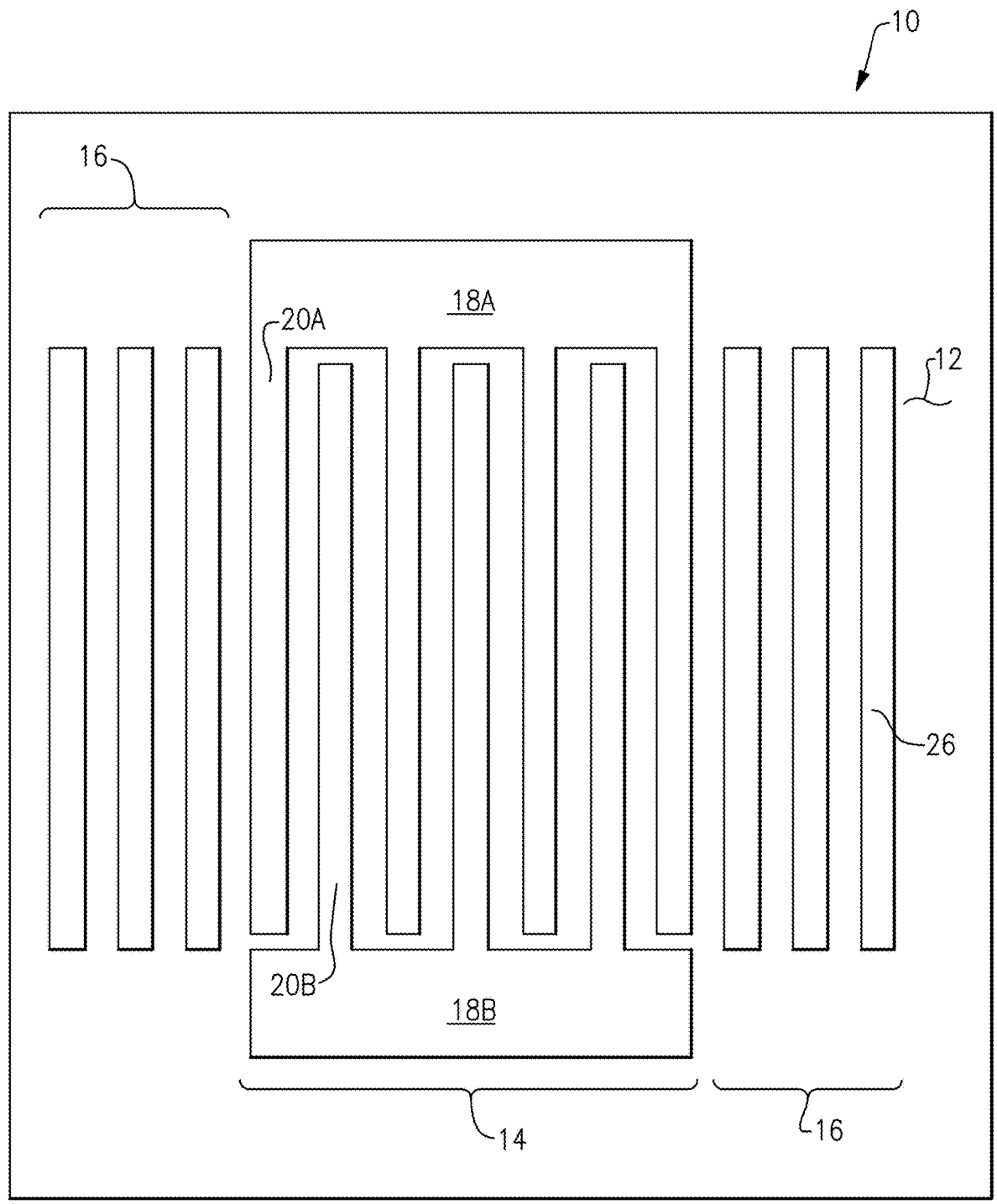
FIG. 1B is a simplified plan view of another example of a surface acoustic wave resonator.
Figure 1C:
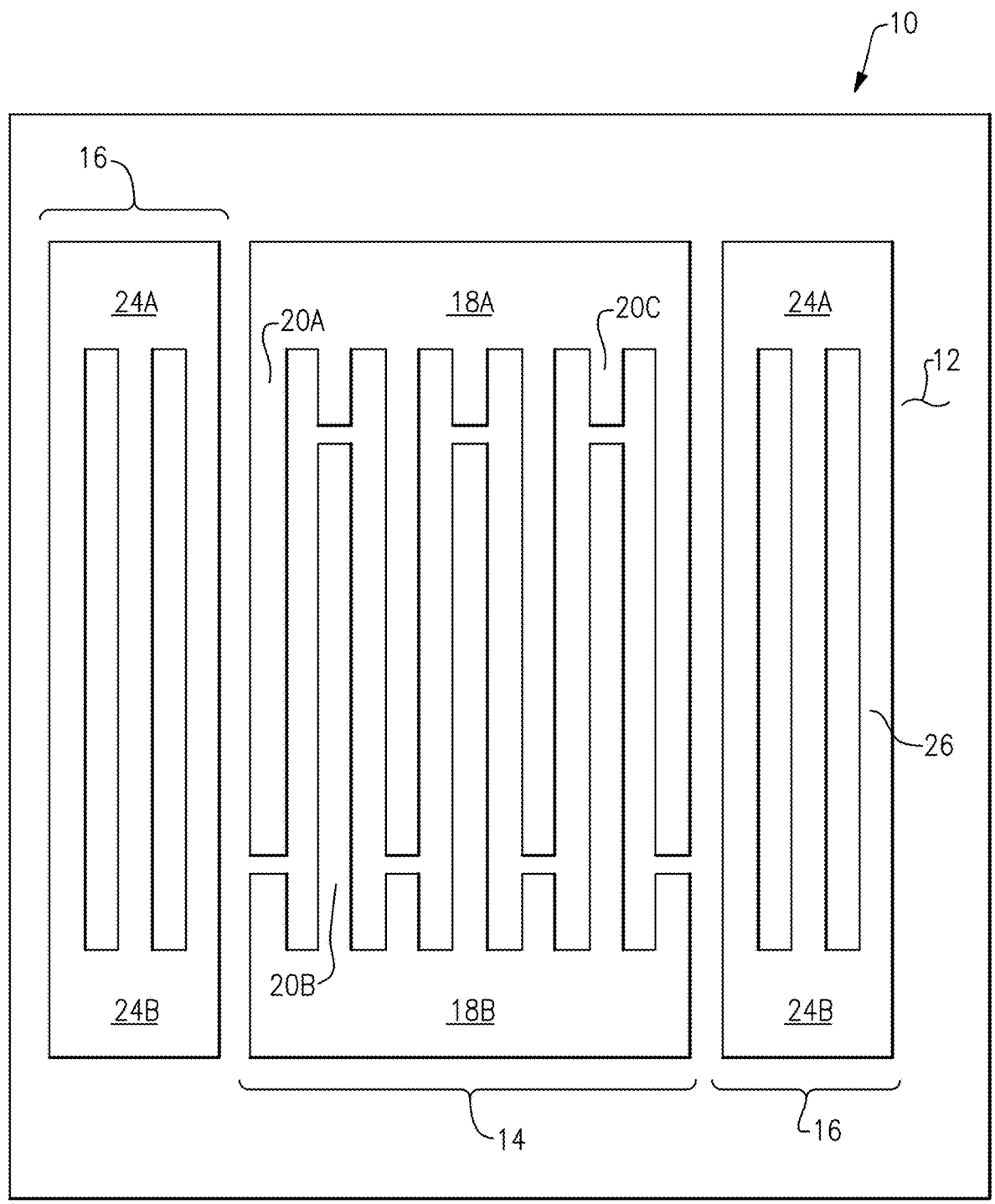
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

Figure 2:
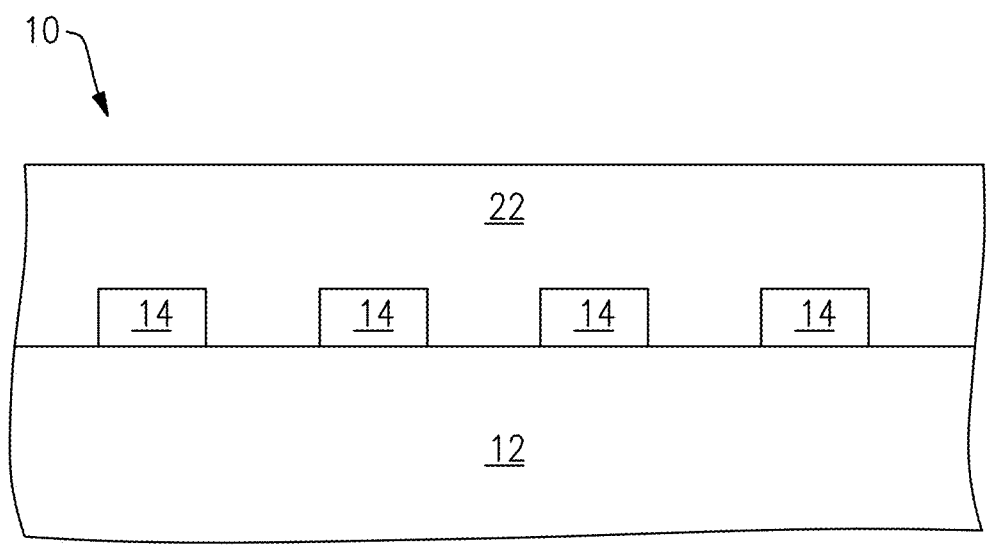
FIG. 2 is a cross-sectional view of a portion of a temperature compensated surface acoustic wave resonator.

FIG. 2 is a partial cross-sectional view of a portion of the acoustic wave resonator 10 of any of FIGS. 1A-1C illustrating a few of the IDT electrodes 14 disposed on the substrate 12. The IDT electrodes 14 are formed of a metal or metal alloy, for example, aluminum. In some embodiments the IDT electrodes 14 may include multiple layers of different metals, for example, molybdenum and aluminum. A dielectric material 22, for example, silicon dioxide ($SiO_2$) may be disposed on top of the IDT electrodes 14 and substrate 12. The dielectric material may advantageously decrease the effect of changes in temperature upon operating characteristics of the acoustic wave resonator 10 and may protect the IDT electrodes 14 and surface of the substrate 12. For example, $SiO_2$ has a negative coefficient of thermal expansion while materials typically used for the piezoelectric substrate 12 in a SAW device have a positive coefficient of thermal expansion. The layer of $SiO_2$ 22 may thus oppose changes in dimensions of piezoelectric substrate 12 with changes in temperature that might otherwise occur in the absence of the layer of $SiO_2$ 22. SAW devices including a layer of $SiO_2$ as illustrated in FIG. 2 may be referred to as temperature-compensated SAW devices, often abbreviated as TC-SAW devices.

It should be appreciated that the acoustic wave resonators illustrated in FIGS. 1A-2, as well as those illustrated in other figures presented herein, are illustrated in a highly simplified form. The relative dimensions of the different features are not shown to scale. Further, typical acoustic wave resonators would commonly include a far greater number of electrode fingers and/or reflector fingers than illustrated. The acoustic wave resonators may be configured differently than illustrated in some examples, for example, to include dummy electrode fingers, electrode fingers with different or non-uniform length or width dimensions, electrode fingers or reflector fingers with different or non-uniform spacing, or electrode fingers that include bent or tilted portions. Typical acoustic wave resonators or filter elements may also include multiple IDT electrodes sandwiched between the reflector electrodes.

As technology advances, consumers and manufacturers continue to demand additional functionality in a smaller footprint in electronic devices, for example, cellular telephones or other radio frequency devices that may utilize SAW devices as disclosed herein. One method of reducing the footprint of one or more SAW devices or acoustic filters is to use a stacked structure in which multiple substrates and associated devices are stacked one on another. The stacked structure may include more devices per unit area than the individual substrates would if not stacked.

Figure 3:
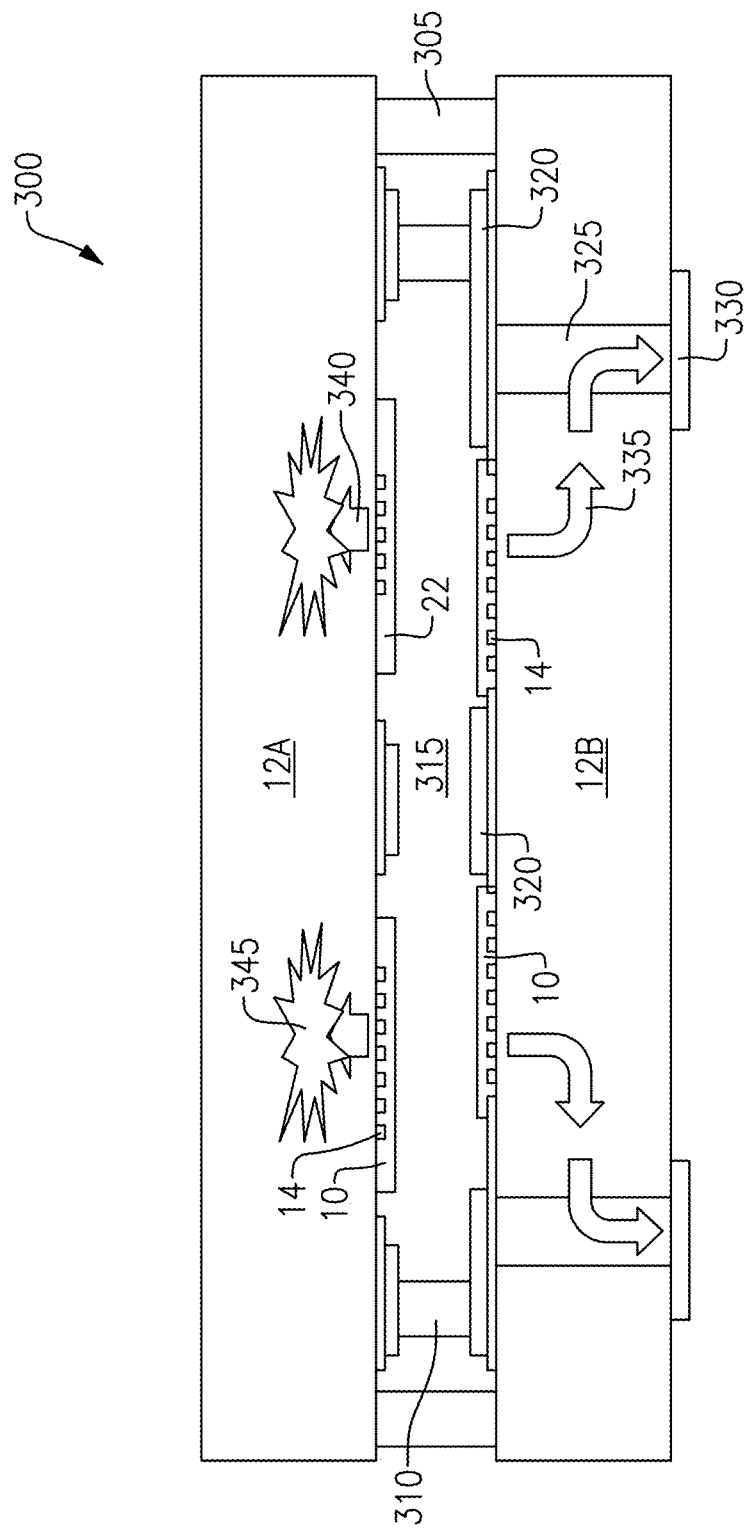
FIG. 3 is a cross-sectional view of an example of an electronic device including stacked piezoelectric substrates and acoustic wave devices.

One example of a stacked SAW device structure is illustrated generally at 300 in FIG. 3. The stacked structure 300 includes an upper piezoelectric substrate 12A bonded to a lower piezoelectric substrate 12B by a frame 305 and internal vias 310. The frame 305 and internal vias 310 may each be formed of a metal, for example, Cu, Al, or Au or may be formed by transient liquid phase bonding using alloys of, for example, Au—Sn and Cu—Sn. The frame 305 circumscribes peripheries of the substrates 12A, 12B and, together with the inward facing surfaces of the substrates 12A, 12B, defines a cavity 315 between the inward facing surfaces of the substrates 12A, 12B. On the inward facing surfaces of the substrates 12A, 12B within the cavity 315 there are one or more SAW devices 10, for example, SAW resonators, each having associated IDT electrodes 14. The SAW devices may include dielectric layers 22, for example $SiO_2$ layers, covering the IDT electrodes 14 and thus may be TC-SAW devices. Electrical traces 320 formed of, for example, Cu or Al may electrically connect the SAW devices 10 and internal vias 310 as well as through wafer vias 325 that electrically connect the SAW devices 10 to external electrodes 330. The through wafer vias 325 and/or external electrodes 330 may be formed of a metal, for example, Cu or an alloy, for example, a solder alloy. The SAW devices 10 may, in some embodiments, form one or more RF filters, for example, a transmit and receive filter of a RF duplexer or a diplexer.

SAW devices, for example, the acoustic wave resonators 10 of FIGS. 1A-2 or the stacked TC-SAW structure illustrated in FIG. 3, typically generate heat during operation. Sources of heat may include, for example, Joule heating of the IDT electrodes 14 due to the passage of current through the electrodes. Operating parameters of SAW devices often vary with temperature. For example, in a radio frequency filter formed of SAW resonators, the resonant and anti-resonant frequencies of the filter may both decrease with temperature. Temperature dependence of operating parameters of a SAW device is undesirable because one typically would desire a device that operates consistently under different operating conditions. Accordingly, it may be desirable to dissipate heat generated in a SAW device in operation as quickly and efficiently as possible to keep the device from heating up to a temperature at which the operating parameters of the device shift more than an acceptable amount.

One problem with the stacked SAW device structure 300 illustrated in FIG. 3 is that heat dissipation from the IDT electrodes 14 may be less than ideal. The material of the substrates 12A, 12B may exhibit a low thermal conductivity. Lithium tantalate, for example, has a thermal conductivity of about 2.93 W/mK. Accordingly, heat generated during operation of the SAW devices 10 may build up about the IDT electrodes 14, resulting in localized heating that may adversely affect the operating parameters of the SAW devices 10. Heat may flow outward from the lower stacked piezoelectric substrate 12B in the structure 300 of FIG. 3 through the through wafer vias 325, as illustrated by the arrows 335, and into a circuit board or other substrate to which the structure 300 is attached. Heat generated in the SAW devices 10 on the upper piezoelectric substrate 12A, however, has a long path to the through wafer vias 325 and thus the upper piezoelectric substrate 12A may exhibit less temperature dissipation than desirable and may heat up, as indicated by the arrows 340 and heated regions 345, to undesired temperatures during operation that may affect the performance of the SAW devices 10 on the upper piezoelectric substrate 12A. It may thus be desirable to provide a path for heat to flow away from the IDT electrodes 14 in the SAW devices 10 in the upper piezoelectric substrate 12A that is more thermally conductive than the piezoelectric substrate 12A itself.

Figure 4:
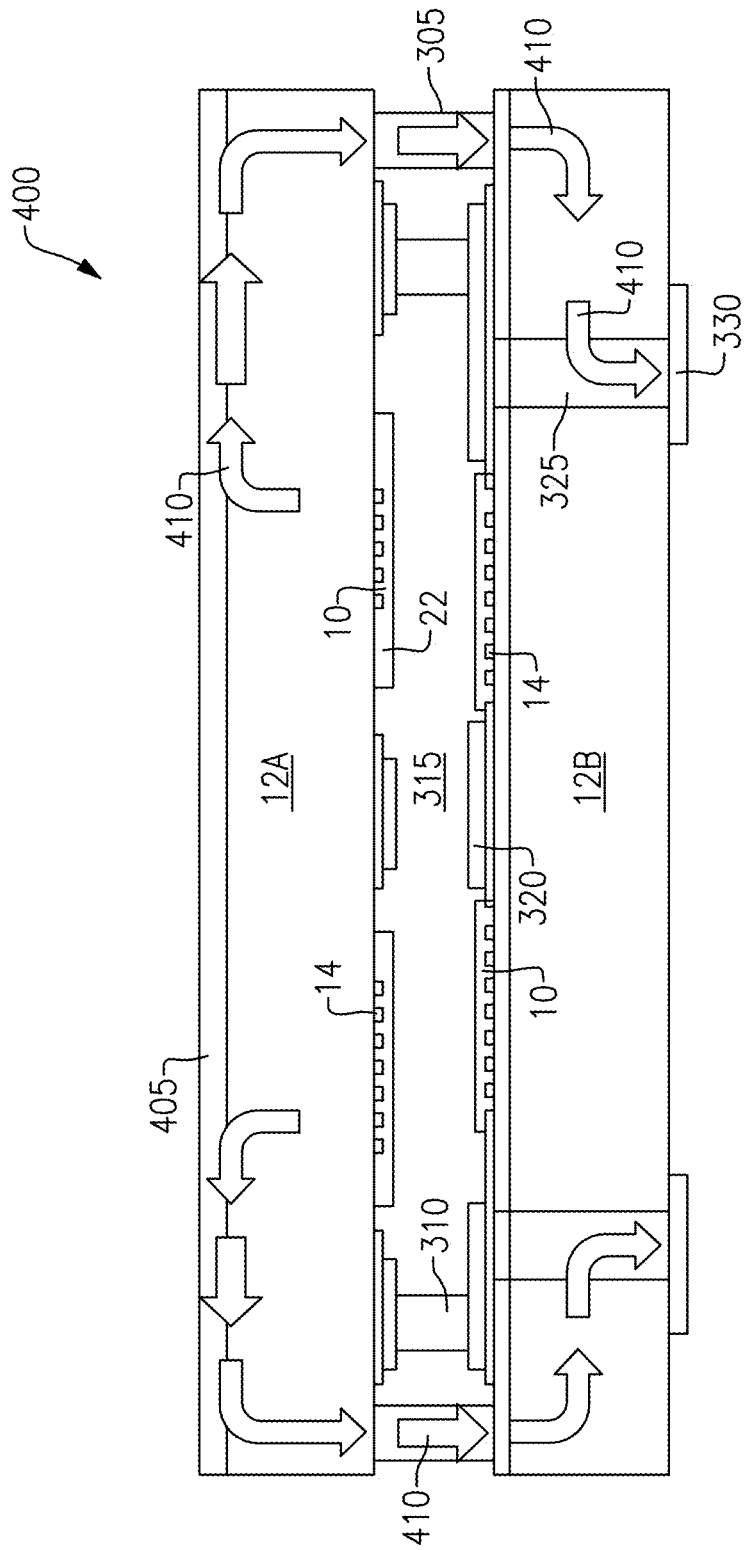
FIG. 4 is a cross-sectional view of an example of an electronic device including stacked piezoelectric substrates and acoustic wave devices in accordance with an aspect of the present disclosure.

One method and structure for enhancing heat dissipation from the IDT electrodes 14 in an acoustic wave resonator 10 in the upper piezoelectric substrate 12A in a stacked substrate structure such as illustrated in FIG. 3 is illustrated in FIG. 4, generally at 400. The method involves adding a layer of material 405 having a higher thermal conductivity than that of the piezoelectric substrate 12A on the top outer facing surface of the piezoelectric substrate 12A. The layer of material 405 may include one or more of silicon, which has a thermal conductivity of from about 50 W/mK to 200 W/mK depending on temperature, silicon nitride ($Si_3N_4$, thermal conductivity of about 30 W/mK), aluminum nitride (AlN, thermal conductivity of about 140-180 W/mK), aluminum oxide ($Al_2O_3$, thermal conductivity of about 18 W/mK), spinel ($MgAl_2O_4$, thermal conductivity of about 16 W/mK), diamond (thermal conductivity of over 1,000 W/mK), or any other suitable material. The layer of material 405 may be referred to as a thermal conductive sheet 405. The thermal conductive sheet 405 helps transfer heat from areas in the upper piezoelectric substrate 12A proximate the SAW devices 10 to the periphery of the upper piezoelectric substrate 12A, through the frame 305 and/or internal vias 310, into the lower piezoelectric substrate 12B and out of the stacked substrate structure 400 through the through wafer vias 325 and bond pads 330 as indicated by the arrows 410.

The thickness of the thermal conductive sheet 405 may be selected based on its composition, power rating and heat generating capacity of the SAW devices 10 in the structure 400, thickness of the piezoelectric substrates 12A, 12B, and desired maximum operating temperature of the piezoelectric substrates 12A, 12B. In one simulation with a thermal conductive sheet 405 formed of silicon the maximum operating temperature of the upper piezoelectric substrate in a structure similar to that illustrated in FIG. 4 dropped rapidly with thickness of the thermal conductive sheet 405, but with little additional benefit gained after the thermal conductive sheet 405 was about 50 μm thick. (See FIG. 5.) Accordingly, an effective thickness for the thermal conductive sheet 405 in various embodiments may be between about 2 μm and about 50 μm.

Embodiments disclosed herein are not limited to stacks of two piezoelectric substrates. In another embodiment, illustrated generally at 600 in FIG. 6, two structures similar to that illustrated in FIG. 4 may be stacked one on top of the other with the respective thermal conductive sheets 405 disposed against and bonded to each other to form a stacked structure with four piezoelectric substrates 12A-12D and associated SAW devices 10.

Figure 7B:
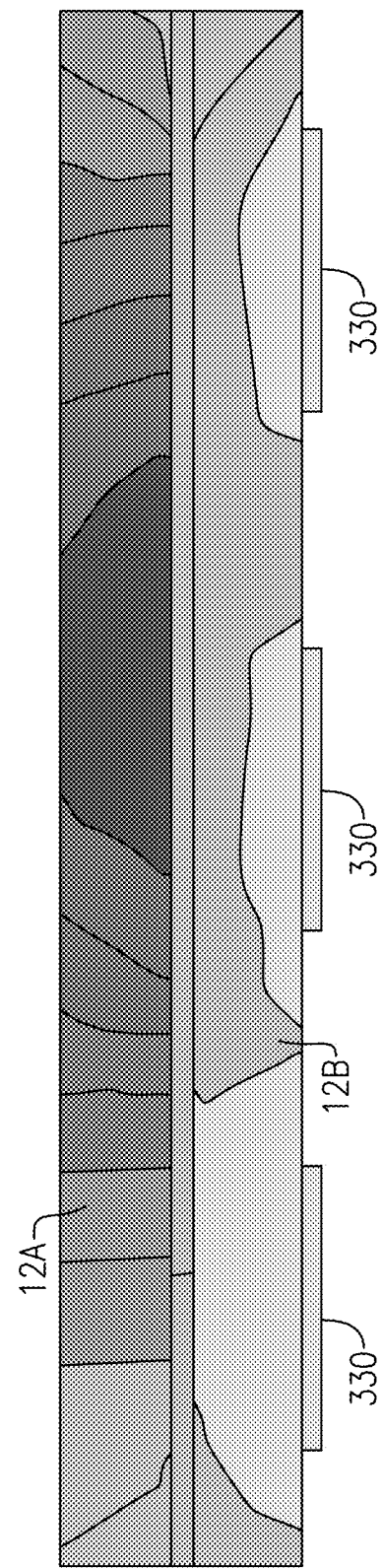
FIG. 7B is a cross-sectional view illustrating results of a simulation of operating temperature of a device as illustrated in FIG. 3.
Figure 8B:
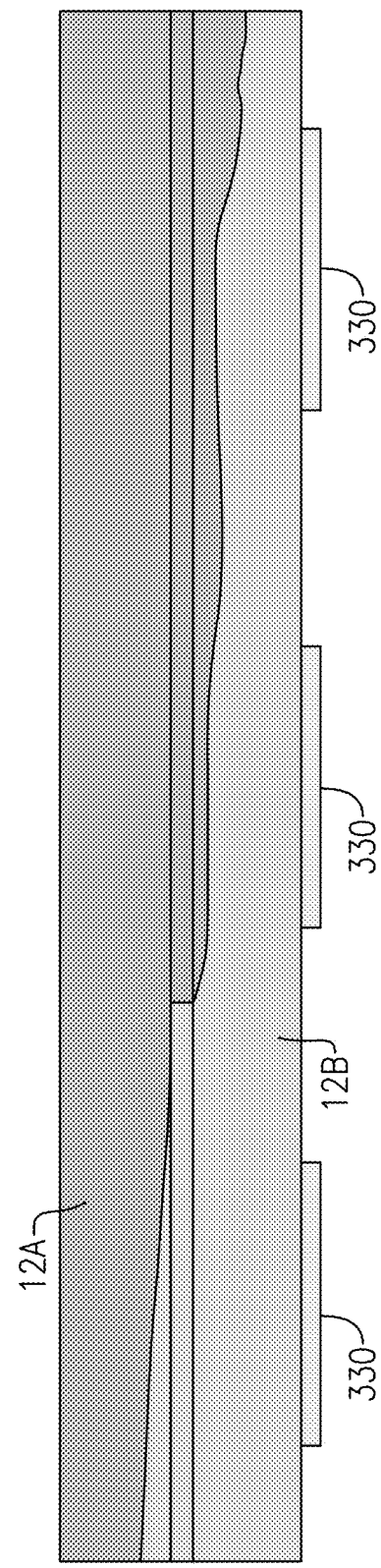
FIG. 8B is a cross-sectional view illustrating results of a simulation of operating temperature of a device as illustrated in FIG. 4.

Simulations were performed to evaluate the effect of a thermal conductive sheet 405 on operating temperature of a stacked SAW device structure as illustrated in FIGS. 3 and 4. FIGS. 7A and 7B are a partially transparent isometric view and a cross-sectional view, respectively, of the operating temperature distribution in a stacked SAW device structure as illustrated in FIG. 3 without a thermal conductive sheet 405. It can be seen from these figures that the greatest temperatures (about 150° C.) were observed in portions of the upper piezoelectric substrate above the locations of the SAW devices 10 in the structure. In comparison, the simulation showed that a similar device operated at the same power levels but including a thermal conductive sheet 405 of a 10 μm thick layer of silicon would exhibit a maximum temperature of 76° C. in the upper piezoelectric substrate as illustrated in FIGS. 8A and 8B. The presence of the thermal conductive sheet 405 resulted in a significant decrease in the operating temperature of the upper piezoelectric substrate 12A. Each of these simulations showed the lower piezoelectric substrate 12B heating up much less than the upper piezoelectric substrate 12A, presumably due to the shorter thermal path from the SAW devices in the lower substrate 12B to the bond pads and out of the structure than the thermal path for the SAW devices in the upper substrate 12A.

Figure 9A:
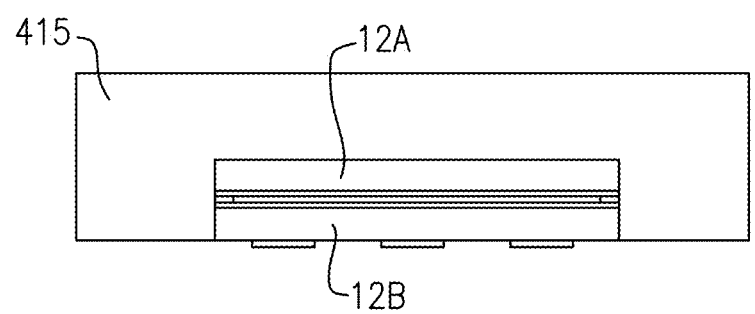
FIG. 9A is a cross-sectional view of a device as illustrated in FIG. 3 encapsulated in molding material.
Figure 9B:
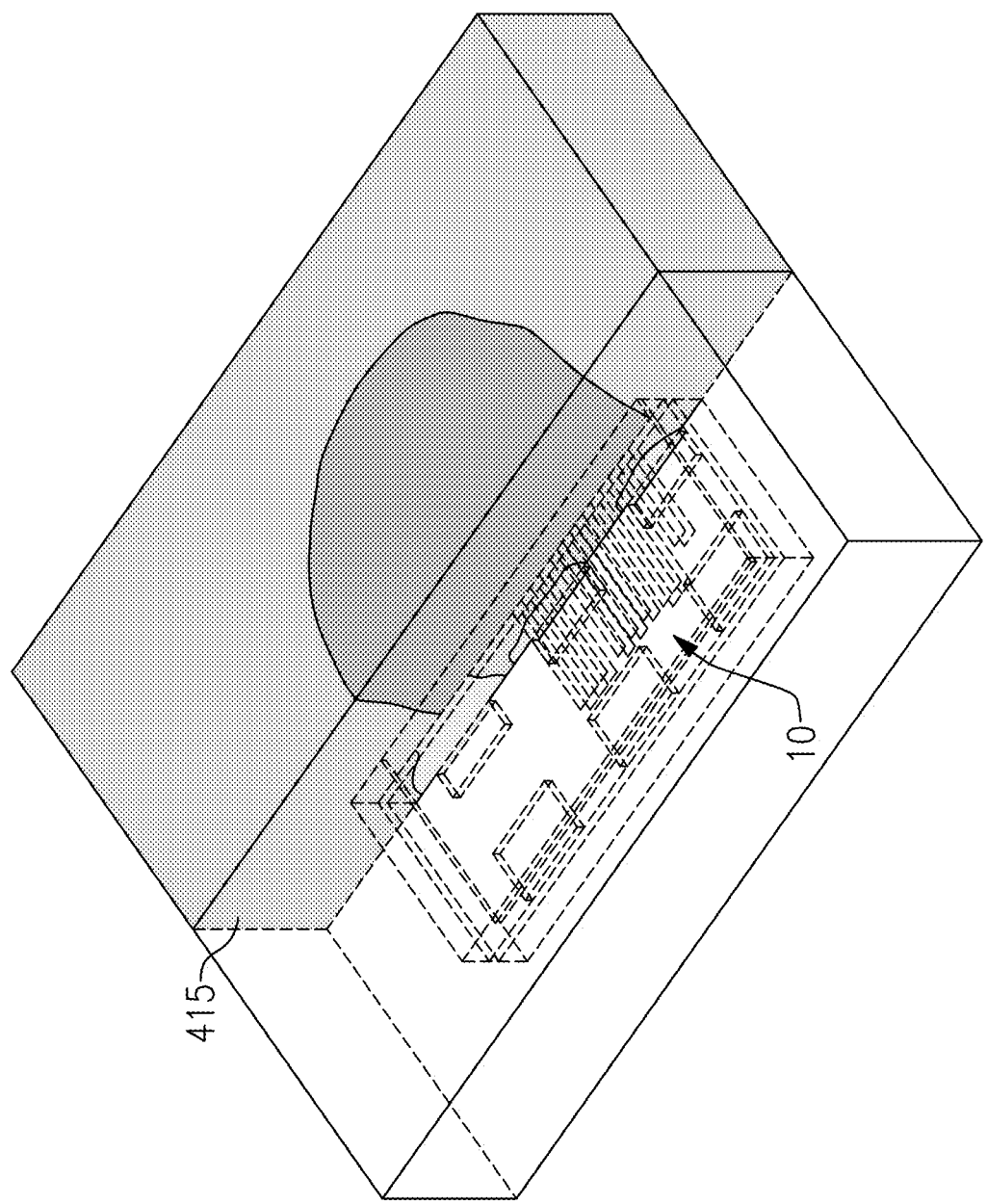
FIG. 9B is an isometric view illustrating results of a simulation of operating temperature of a device as illustrated in FIG. 9A.
Figure 10A:
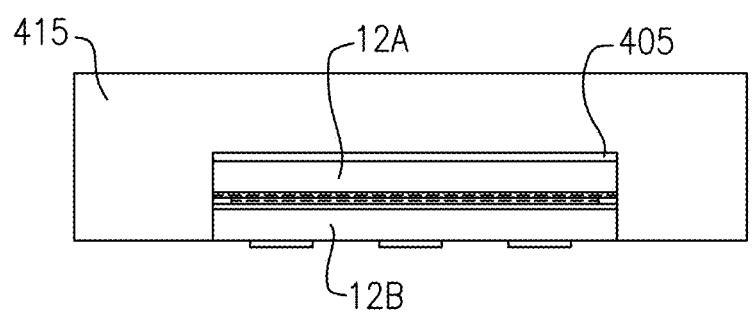
FIG. 10A is a cross-sectional view of a device as illustrated in FIG. 4 encapsulated in molding material.
Figure 10B:
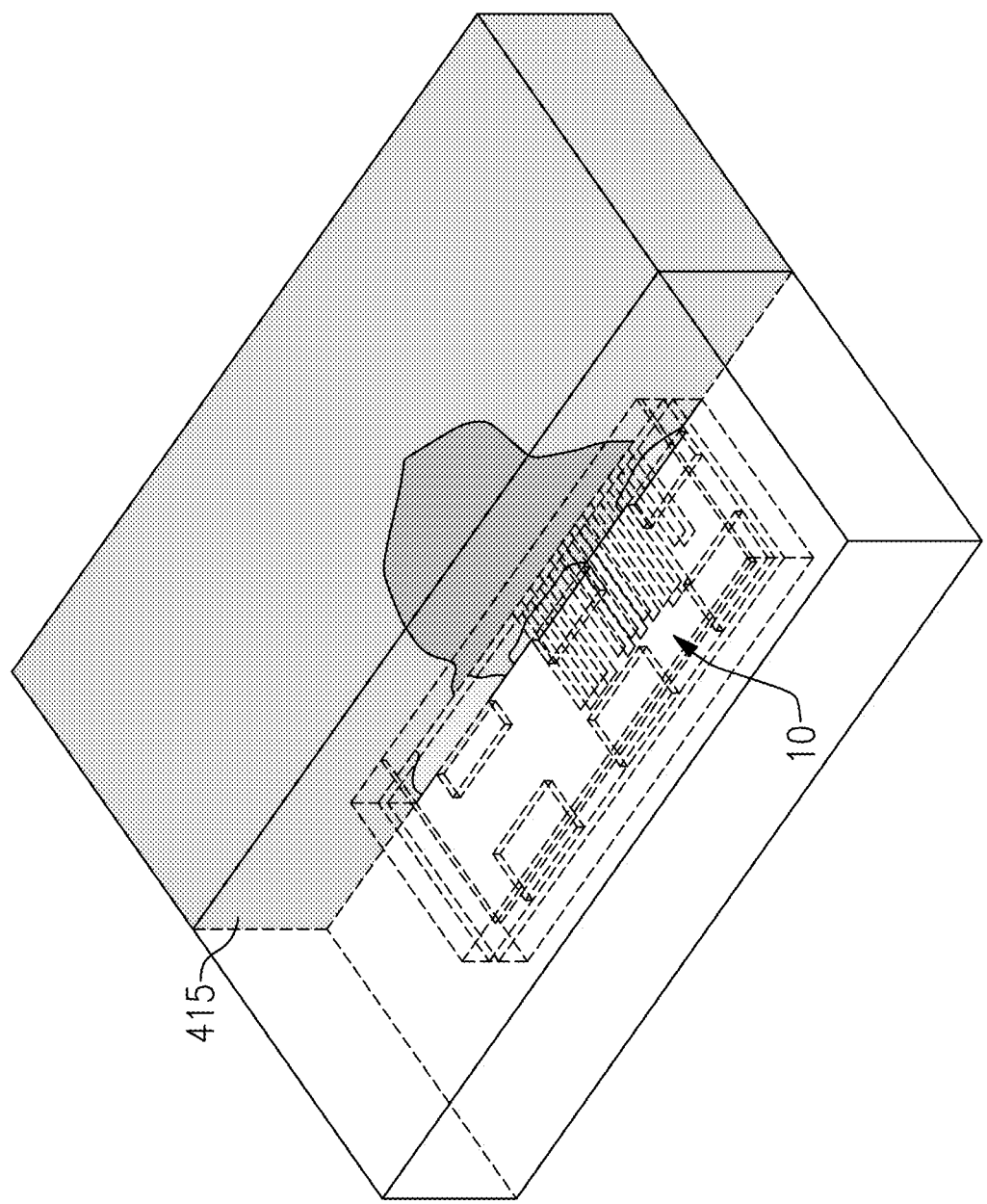
FIG. 10B is an isometric view illustrating results of a simulation of operating temperature of a device as illustrated in FIG. 10A.

The simulations were repeated for the stacked SAW device structures encapsulated in 50 μm thick molding material 415 as illustrated in FIGS. 9A and 10A. The results of these simulations are illustrated in FIGS. 9B and 10B. The simulations showed the upper piezoelectric substrate 12A in the molded structure without the thermal conductive sheet 405 reaching a maximum temperature of 63° C. while the upper piezoelectric substrate 12A in the molded structure with the thermal conductive sheet 405 reached a maximum temperature of 57°. These temperatures were much lower than in the simulation results shown in FIGS. 7A-8B, presumably due to heat dissipation in the molding material 415. The thermal conductive sheet 405, however, still resulted in the upper piezoelectric substrate 12A reaching a lower maximum operating temperature than the lower piezoelectric substrate 12B.

Figure 11:
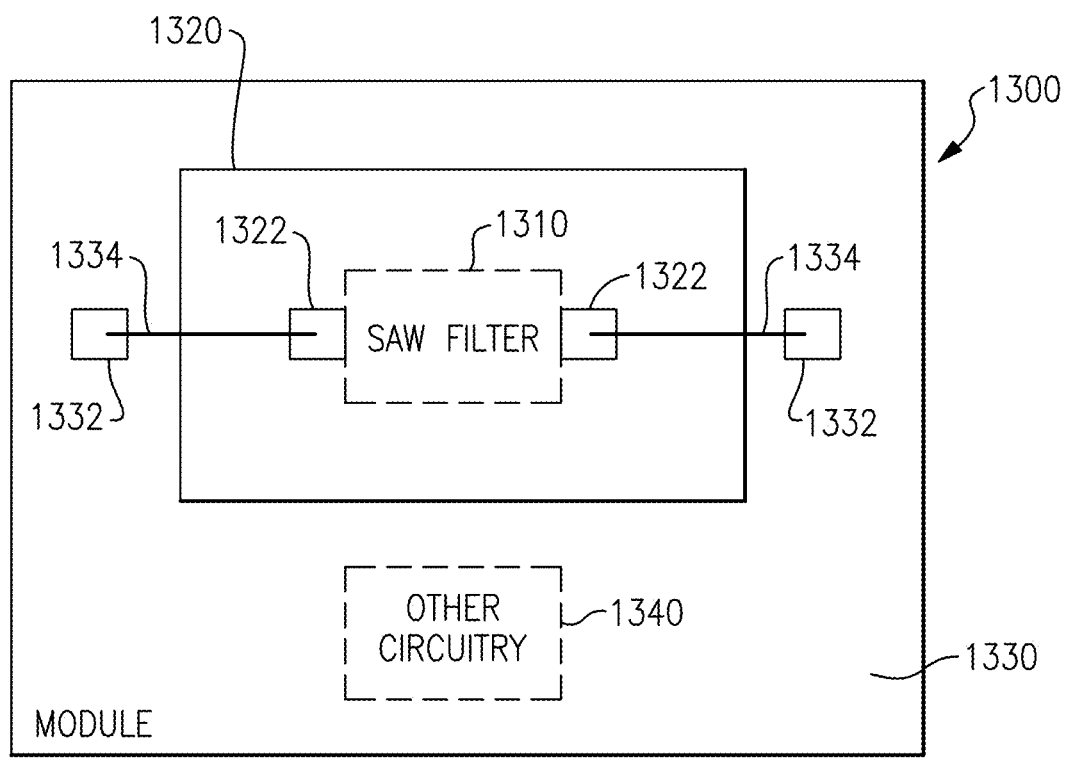
FIG. 11 is a block diagram of one example of a filter module that can include one or more electronic devices according to aspects of the present disclosure.
Figure 12:
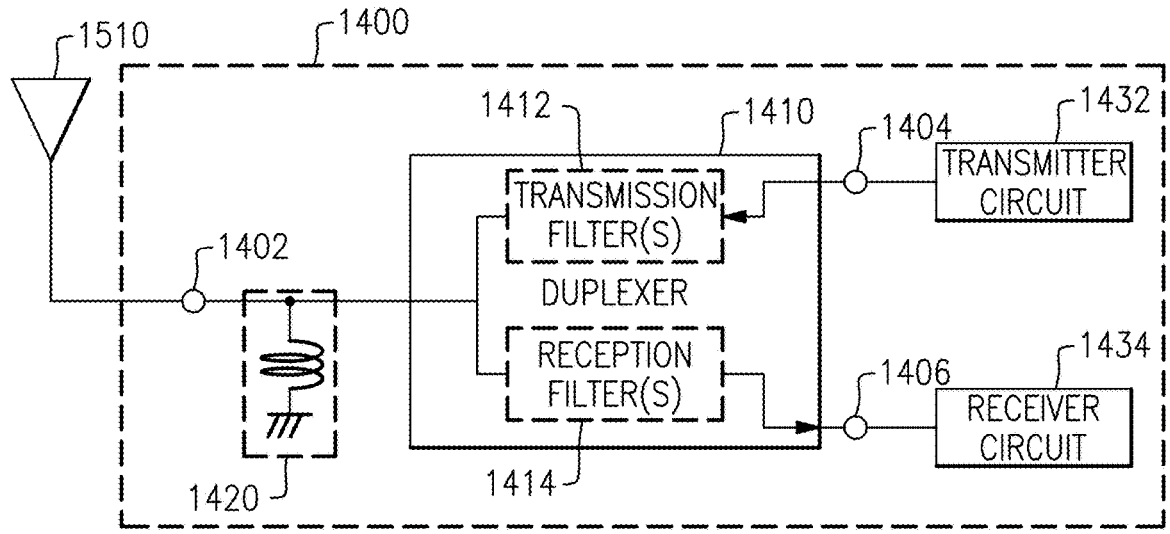
FIG. 12 is a block diagram of one example of a front-end module that can include one or more filter modules according to aspects of the present disclosure.
Figure 13:
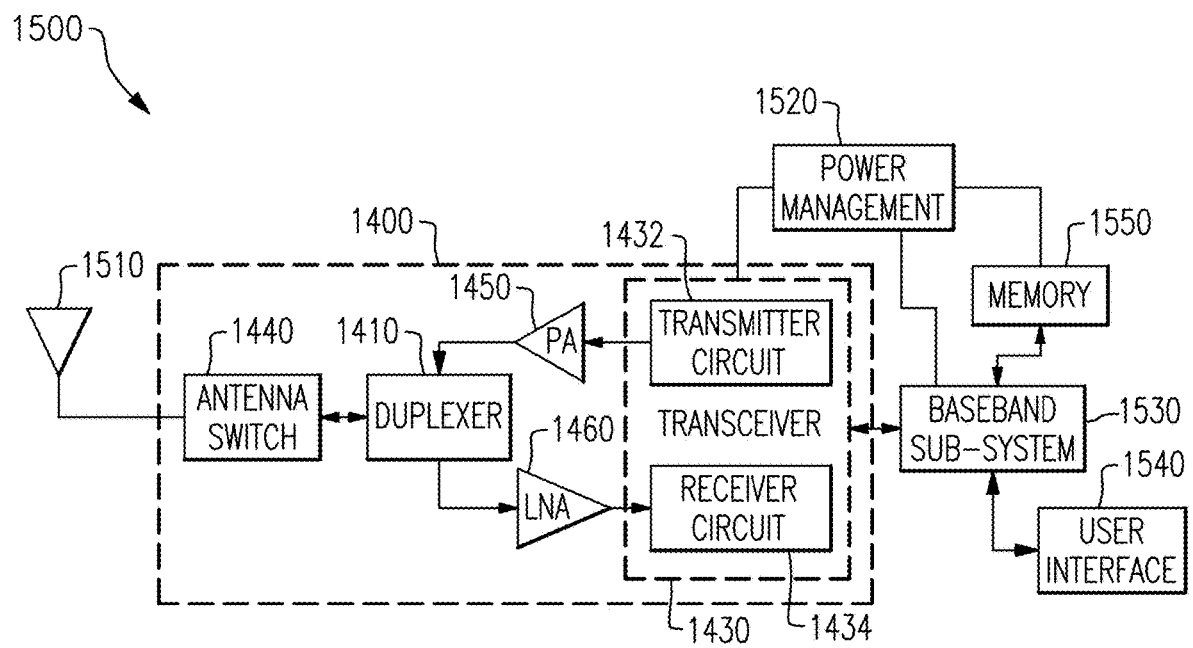
FIG. 13 is a block diagram of one example of a wireless device including the front-end module of FIG. 12.

Stacked piezoelectric substrate structures including surface acoustic wave devices as discussed herein can be implemented in a variety of packaged modules. Some example packaged modules will now be discussed in which any suitable principles and advantages of the packaged acoustic wave devices discussed herein can be implemented. FIGS. 11, 12, and 13 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 11 is a block diagram illustrating one example of a module 1300 including a SAW filter 1310. The SAW filter 1310 may be implemented on one or more die(s) 1320 including one or more connection pads 1322. For example, the SAW filter 1310 may include a connection pad 1322 that corresponds to an input contact for the SAW filter and another connection pad 1322 that corresponds to an output contact for the SAW filter. The packaged module 1300 includes a packaging substrate 1330 that is configured to receive a plurality of components, including the die 1320. A plurality of connection pads 1332 can be disposed on the packaging substrate 1330, and the various connection pads 1322 of the SAW filter die 1320 can be connected to the connection pads 1332 on the packaging substrate 1330 via electrical connectors 1334, which can be solder bumps or wirebonds, for example, to allow for passing of various signals to and from the SAW filter 1310. The module 1300 may optionally further include other circuitry die 1340, such as, for example one or more additional filter(s), amplifiers, pre-filters, modulators, demodulators, down converters, and the like, as would be known to one of skill in the art of semiconductor fabrication in view of the disclosure herein. In some embodiments, the module 1300 can also include one or more packaging structures to, for example, provide protection and facilitate easier handling of the module 1300. Such a packaging structure can include an overmold formed over the packaging substrate 1330 and dimensioned to substantially encapsulate the various circuits and components thereon.

Various examples and embodiments of the SAW filter 1310 can be used in a wide variety of electronic devices. For example, the SAW filter 1310 can be used in an antenna duplexer, which itself can be incorporated into a variety of electronic devices, such as RF front-end modules and communication devices.

Referring to FIG. 12, there is illustrated a block diagram of one example of a front-end module 1400, which may be used in an electronic device such as a wireless communications device (e.g., a mobile phone) for example. The front-end module 1400 includes an antenna duplexer 1410 having a common node 1402, an input node 1404, and an output node 1406. An antenna 1510 is connected to the common node 1402.

The antenna duplexer 1410 may include one or more transmission filters 1412 connected between the input node 1404 and the common node 1402, and one or more reception filters 1414 connected between the common node 1402 and the output node 1406. The passband(s) of the transmission filter(s) are different from the passband(s) of the reception filters. Examples of the SAW filter 1310 can be used to form the transmission filter(s) 1412 and/or the reception filter(s) 1414. An inductor or other matching component 420 may be connected at the common node 1402.

The front-end module 1400 further includes a transmitter circuit 1432 connected to the input node 1404 of the duplexer 1410 and a receiver circuit 1434 connected to the output node 1406 of the duplexer 1410. The transmitter circuit 1432 can generate signals for transmission via the antenna 1510, and the receiver circuit 1434 can receive and process signals received via the antenna 1510. In some embodiments, the receiver and transmitter circuits are implemented as separate components, as shown in FIG. 12, however in other embodiments these components may be integrated into a common transceiver circuit or module. As will be appreciated by those skilled in the art, the front-end module 1400 may include other components that are not illustrated in FIG. 12 including, but not limited to, switches, electromagnetic couplers, amplifiers, processors, and the like.

FIG. 13 is a block diagram of one example of a wireless device 1500 including the antenna duplexer 1410 shown in FIG. 12. The wireless device 1500 can be a cellular phone, smart phone, tablet, modem, communication network or any other portable or non-portable device configured for voice or data communication. The wireless device 1500 can receive and transmit signals from the antenna 1510. The wireless device includes an embodiment of a front-end module 1400 similar to that discussed above with reference to FIG. 12. The front-end module 1400 includes the duplexer 1410, as discussed above. In the example shown in FIG. 13 the front-end module 1400 further includes an antenna switch 1440, which can be configured to switch between different frequency bands or modes, such as transmit and receive modes, for example. In the example illustrated in FIG. 13, the antenna switch 1440 is positioned between the duplexer 1410 and the antenna 1510; however, in other examples the duplexer 1410 can be positioned between the antenna switch 1440 and the antenna 1510. In other examples the antenna switch 1440 and the duplexer 1410 can be integrated into a single component.

The front-end module 1400 includes a transceiver 1430 that is configured to generate signals for transmission or to process received signals. The transceiver 1430 can include the transmitter circuit 1432, which can be connected to the input node 1404 of the duplexer 1410, and the receiver circuit 1434, which can be connected to the output node 1406 of the duplexer 1410, as shown in the example of FIG. 12.

Signals generated for transmission by the transmitter circuit 1432 are received by a power amplifier (PA) module 1450, which amplifies the generated signals from the transceiver 1430. The power amplifier module 1450 can include one or more power amplifiers. The power amplifier module 1450 can be used to amplify a wide variety of RF or other frequency-band transmission signals. For example, the power amplifier module 1450 can receive an enable signal that can be used to pulse the output of the power amplifier to aid in transmitting a wireless local area network (WLAN) signal or any other suitable pulsed signal. The power amplifier module 1450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 1450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 13, the front-end module 1400 may further include a low noise amplifier module 1460, which amplifies received signals from the antenna 1510 and provides the amplified signals to the receiver circuit 1434 of the transceiver 1430.

The wireless device 1500 of FIG. 13 further includes a power management sub-system 1520 that is connected to the transceiver 1430 and manages the power for the operation of the wireless device 1500. The power management system 1520 can also control the operation of a baseband sub-system 1530 and various other components of the wireless device 1500. The power management system 1520 can include, or can be connected to, a battery (not shown) that supplies power for the various components of the wireless device 1500. The power management system 1520 can further include one or more processors or controllers that can control the transmission of signals, for example. In one embodiment, the baseband sub-system 1530 is connected to a user interface 1540 to facilitate various input and output of voice and/or data provided to and received from the user. The baseband sub-system 1530 can also be connected to memory 1550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device comprising:
   a first substrate having a first surface bonded to a first surface of a second substrate by a frame circumscribing peripheries of the first substrate and second substrate and extending from the first surface of the first substrate to the first surface of the second substrate;
   one or more acoustic wave devices disposed on the first surface of each of the first substrate and the second substrate; and
   a thermally conductive layer disposed on a second surface of the first substrate opposite the first surface of the first substrate, the thermally conductive layer having a higher thermal conductivity than a material of which the first substrate is formed to reduce an operating temperature of the first substrate.

2. The electronic device of claim 1 wherein both the first and second substrates are formed of a piezoelectric material.

3. The electronic device of claim 2 wherein the one or more acoustic wave devices are surface acoustic wave devices.

4. The electronic device of claim 3 wherein the one or more acoustic wave devices are temperature compensated surface acoustic wave devices.

5. The electronic device of claim 1 wherein the frame is formed of a material with a higher thermal conductivity than the material of which the first substrate is formed.

6. The electronic device of claim 5 wherein the frame is formed of a metal.

7. The electronic device of claim 5 wherein the frame and the first surfaces of the first substrate and second substrate define a cavity in which the one or more acoustic wave devices are disposed.

8. The electronic device of claim 1 further comprising a through wafer via passing from the first side of the second substrate to a second side of the second substrate opposite the first side of the second substrate.

9. The electronic device of claim 1 further comprising one or more vias passing from the first side of the first substrate to the first side of the second substrate and electrically connecting the one or more acoustic wave devices.

10. The electronic device of claim 1 wherein the one or more acoustic wave devices form a radio frequency filter.

11. A radio frequency device module including the electronic device of claim 10.

12. A radio frequency device including the radio frequency module of claim 11.

13. A method of forming an electronic device, the method comprising:
   forming one or more acoustic wave devices on first surfaces of each of a first substrate and a second substrate;
   bonding the first surface of the first substrate to the first surface of the second substrate with a frame circumscribing peripheries of the first substrate and second substrate and extending from the first surface of the first substrate to the first surface of the second substrate; and
   forming a thermally conductive layer on a second surface of the first substrate opposite the first surface of the first substrate, the thermally conductive layer having a higher thermal conductivity than a material of which the first substrate is formed to reduce an operating temperature of the first substrate.

14. The method of claim 13 further comprising forming the frame of a material having a higher thermal conductivity than the material of which the first substrate is formed.

15. The method of claim 14 wherein bonding the first surface of the first substrate to the first surface of the second substrate with the frame includes defining a cavity in which the one or more acoustic wave devices are disposed.

16. The method of claim 13 further comprising forming a through wafer via passing from the first side of the second substrate to a second side of the second substrate opposite the first side of the second substrate.

17. The method of claim 13 further comprising forming a radio frequency filter from the one or more acoustic wave devices.

18. The method of claim 17 further comprising forming a radio frequency device module including the radio frequency filter.

19. The method of claim 18 further comprising forming a radio frequency electronic device including the radio frequency device module.

* * * * *

UNITED STATES PATENT AND TRADEMARK OFFICE
CERTIFICATE OF CORRECTION

| | |
|---|---|
| PATENT NO. | : 11,588,465 B2 |
| APPLICATION NO. | : 17/093756 |
| DATED | : February 21, 2023 |
| INVENTOR(S) | : Hironori Fukuhara et al. |

It is certified that error appears in the above-identified patent and that said Letters Patent is hereby corrected as shown below:

On the Title Page

Item (72) Inventors: delete "Hironori Fukuhara, Ibaraki (JP); Rei Goto, Osaka (JP); Takeshi Furusawa, Toyonaka (JP)" and insert -- Hironori Fukuhara, Ibaraki-Shi (JP); Rei Goto, Osaka-Shi (JP); Takeshi Furusawa, Toyonaka-Shi (JP) --

Signed and Sealed this
Twenty-eighth Day of March, 2023

Katherine Kelly Vidal
*Director of the United States Patent and Trademark Office*